United States Patent
Huang

(10) Patent No.: US 9,360,153 B2
(45) Date of Patent: Jun. 7, 2016

(54) SUPPORTING APPARATUS

(71) Applicant: HON HAI PRECISION INDUSTRY CO., LTD., New Taipei (TW)

(72) Inventor: Fu-Kuo Huang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 19 days.

(21) Appl. No.: 14/552,025

(22) Filed: Nov. 24, 2014

(65) Prior Publication Data
US 2016/0116105 A1    Apr. 28, 2016

(51) Int. Cl.
*F16M 11/00* (2006.01)
*F16M 11/38* (2006.01)
*H05K 5/00* (2006.01)
*H05K 5/02* (2006.01)

(52) U.S. Cl.
CPC .............. *F16M 11/38* (2013.01); *H05K 5/0086* (2013.01); *H05K 5/0204* (2013.01)

(58) Field of Classification Search
USPC ......... 248/454, 455, 457, 460, 461, 462, 463, 248/441.1, 442.2, 443, 444, 370, 371, 165, 248/122
See application file for complete search history.

(56) References Cited

U.S. PATENT DOCUMENTS

| | | | | |
|---|---|---|---|---|
| 5,690,309 A | * | 11/1997 | Blum | A47B 23/041 248/444 |
| 6,007,259 A | * | 12/1999 | Mori | F16M 11/20 248/168 |
| 7,684,694 B2 | * | 3/2010 | Fromm | F16M 11/14 396/376 |
| 2002/0066837 A1 | * | 6/2002 | Dunbar | A47B 19/002 248/122.1 |
| 2004/0188587 A1 | * | 9/2004 | Michell | A47B 19/002 248/457 |
| 2006/0016945 A1 | * | 1/2006 | Taylor | A47B 19/06 248/188.5 |

* cited by examiner

*Primary Examiner* — Steven Marsh
(74) *Attorney, Agent, or Firm* — Novak Druce Connolly Bove + Quigg LLP

(57) ABSTRACT

A supporting apparatus includes a first connection member, a second connection member defining a fixing groove, a third connection member, a fourth connection member and a fifth connection member. The first connection member, the second connection member and the third connection member are rotationally connected to each other head to hail to form a triangle and can be detached from each other. The fourth connection member is detachably attached to and rotatable around the third connection member. The fifth connection member is detachably attached to and rotatable around the fourth connection member. The second connection member defines a connection hole. A portion of the fifth connection member is detachably received in the connection hole to support the triangle.

20 Claims, 5 Drawing Sheets

SUPPORTING APPARATUS

CROSS-REFERENCE TO RELATED APPLICATIONS

This application claims priority to Taiwan Patent Application No. 103137103, filed on Oct. 28, 2014, the contents of which are incorporated by reference herein.

FIELD

The present disclosure relates to a supporting apparatus.

BACKGROUND

When a portable electronic device, for example a tablet computer, is being used, one hand supports the portable electronic device and the other hand operates the functions of the portable electronic device.

BRIEF DESCRIPTION OF THE DRAWINGS

Implementations of the present technology will now be described, by way of example only, with reference to the attached figures.

DETAILED DESCRIPTION

Figure 1:
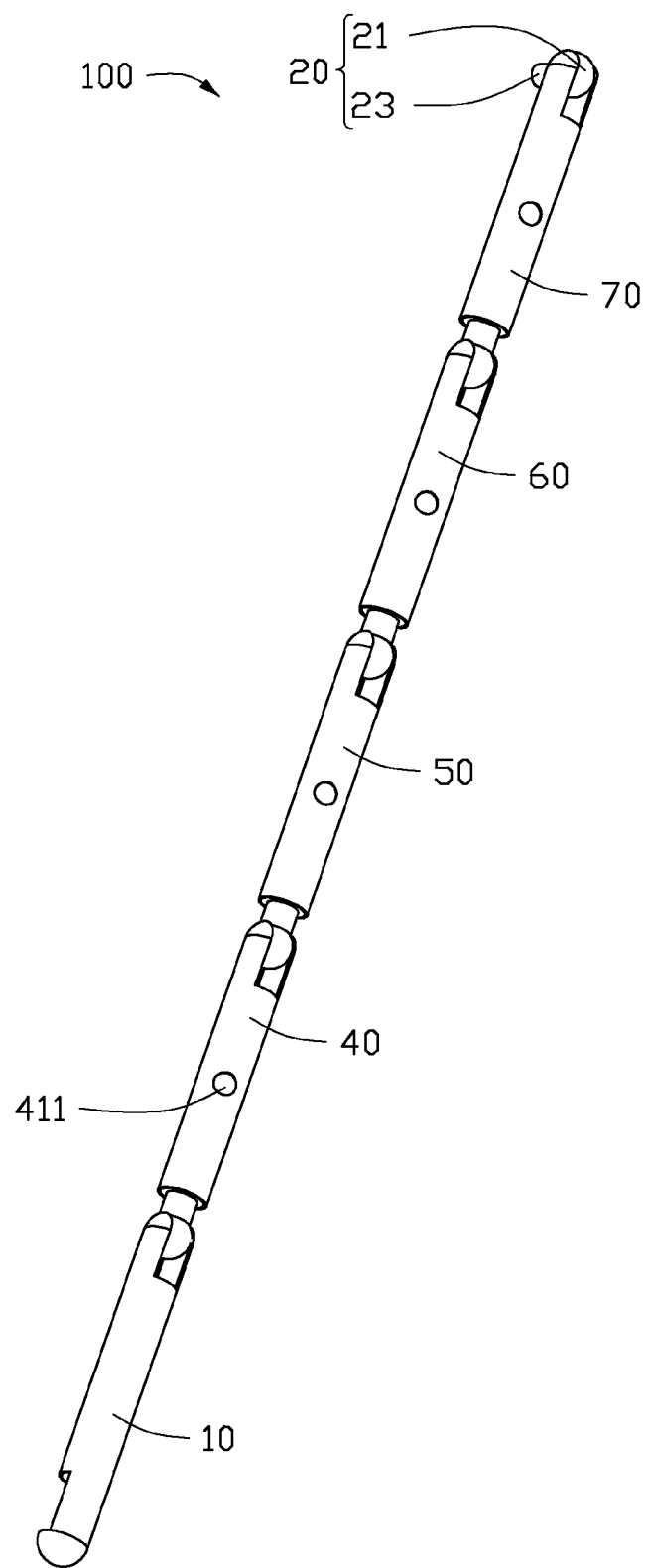
FIG. 1 is an isometric view of a supporting apparatus in a first state according to an exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

FIG. 1 illustrates a supporting apparatus 100 including a first connection member 10, a second connection member 40, a third connection member 50, a fourth connection member 60 and a fifth connection member 70.

Figure 2:
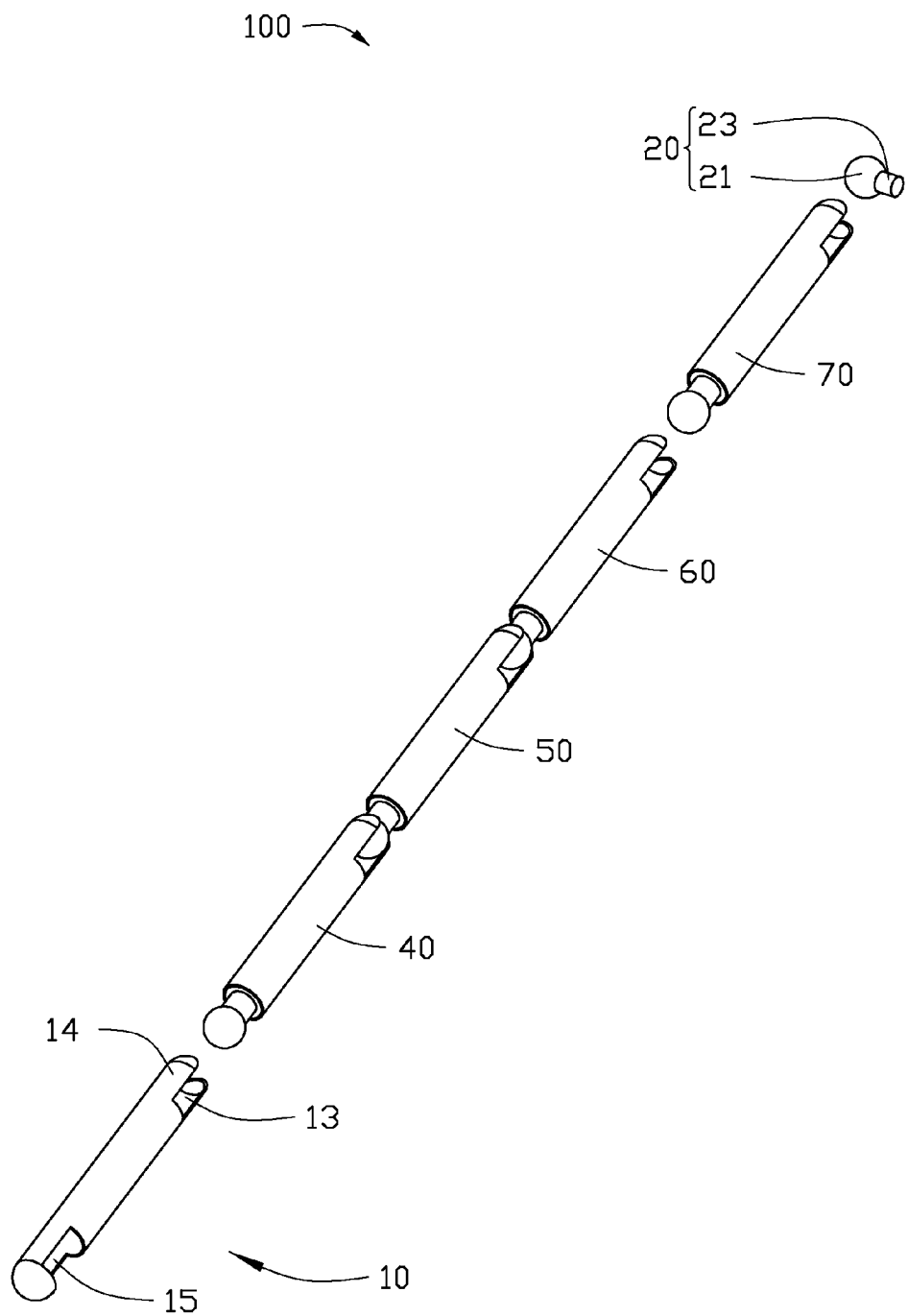
FIG. 2 is an exploded, isometric view of part of the supporting apparatus of FIG. 1.
Figure 3:
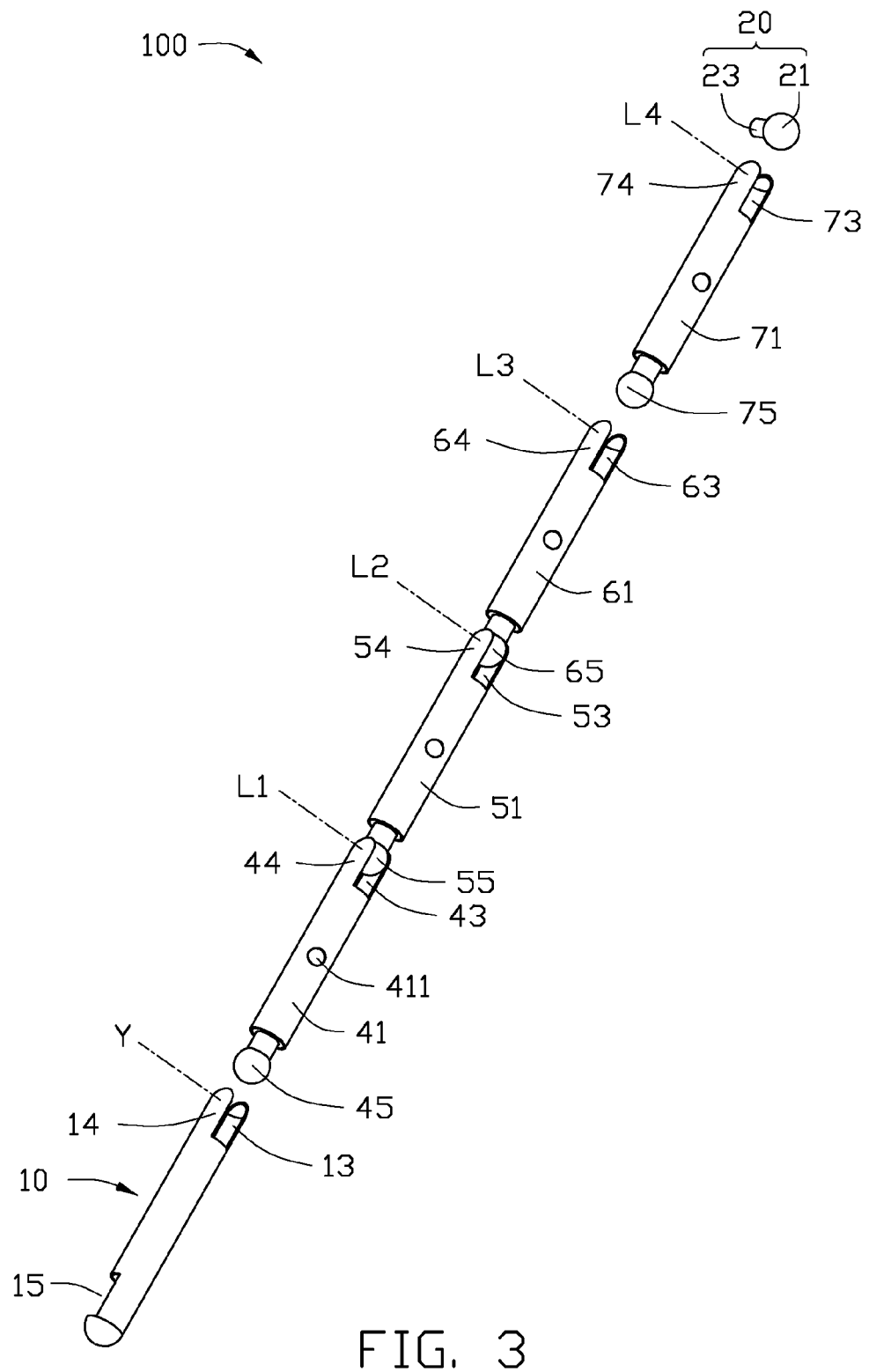
FIG. 3 is similar to FIG. 2, but viewed from another angle.

FIGS. 2 and 3 illustrate that one end of the first connection member 10 defines a first clamping groove 13, and the other end of the first connection member 10 defines a fixing groove 15. In the embodiment, the first connection member 10 is a substantially cylindrical pole. The cylindrical pole includes two first clamp pieces 14 at one end of the cylindrical pole. The two first clamp pieces 14 are substantially parallel. The first clamping groove 13 is positioned between the two first clamp pieces 14. The fixing groove 15 is defined at a lateral surface of the first connection member 10.

The second connection member 40 includes a first pole 41 and a first rotation body 15. The first pole 41 is a substantially cylindrical. The first pole 41 includes two second clamp pieces 44 at one end of the first pole 41. The two second clamp pieces 44 are substantially parallel. A second clamping groove 43 is defined between the two second clamp pieces 44. The first rotation body 45 is attached to the other end of the first pole 41 away from the second clamping groove 43. The first rotation body 45 is received in the first clamping groove 13. The first rotation body 45 is rotatable around a center axis of the first pole 41 in the first clamping groove 13 and rotatable around an axis Y perpendicular to an extended direction of the two first clamp pieces 14. Thus, an angle between the second connection member 40 and the first connection member 10 is adjustable when the second connection member 40 rotates around the axis Y. The second connection member 40 further defines a connection hole 411 between the second clamping groove 43 and the first rotation body 45. In the embodiment, the connection hole 411 is defined on a lateral surface of the second connection member 40. The first rotation body is an elastic ball. A diameter of the ball is greater than a distance between the two first clamp pieces 14. Therefore, the ball can be firmly received in the first clamping groove 13.

Figure 4:
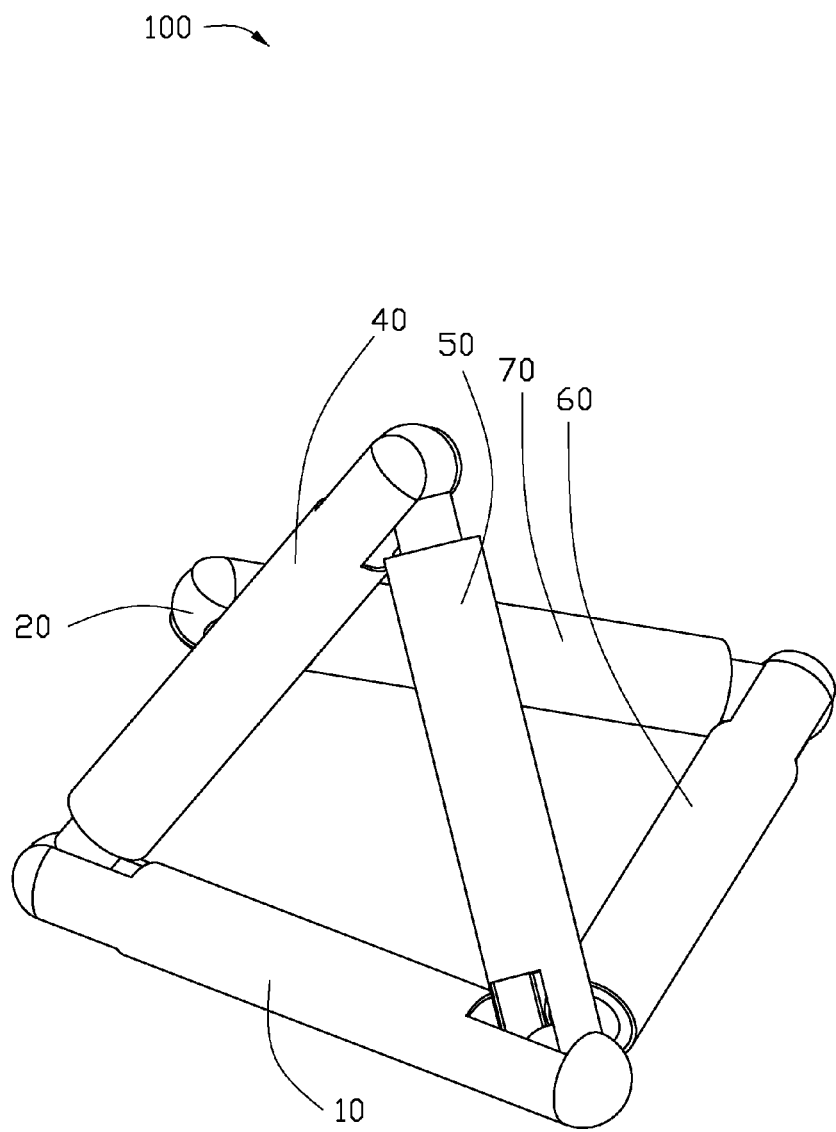
FIG. 4 is an isometric view of the supporting apparatus of FIG. 1 in a second state.

The third connection member 50 has a structure similar to the second connection member 40. The third connection member 50 includes a second pole 51 and a second rotation body 55. The second pole 51 is a substantially cylindrical. The second pole 51 includes two third clamp pieces 55 at one end of the second pole 51. The two third clamp pieces 55 are substantially parallel. A third clamping groove 53 is defined between the two third clamp pieces 55. The second rotation body 55 is attached to the other end of the second pole 51 away from the third clamping groove 53. The second rotation body 55 is received in the second clamping groove 43. The second rotation body 55 is rotatable around a center axis of the second pole 51 in the second clamping groove 43 and rotatable around an axis L1 perpendicular to an extended direction of the two second clamp pieces 44. Thus, an angle between the third connection member 50 and the second connection member 40 is adjustable when the third connection member 50 rotates around the axis L1. FIG. 4 illustrates that a distal end of the two third clamp pieces 54 away from the second rotation body 55 can be received in the fixing groove 15 when the second connection member 10 rotates around the axis Y and the third connection member 50 rotates around the axis L1. Thus, the first connection member 10, the second connection member 40 and the third connection member 50 form a triangle. In the embodiment, the first connection member 10, the second connection member 40 and the third connection member 50 have a same length. Thus, the first connection member 10, the second connection member 40 and the third connection member 50 form an isosceles triangle.

The fourth connection member 60 has a structure similar to the second connection member 40. The fourth connection member 60 includes a third pole 61 and a third rotation body

65. The third pole 61 is a substantially cylindrical. The third pole 61 includes two substantially parallel fourth clamp pieces 64 at one end of the third pole 61. A fourth clamping groove 63 is defined between the two fourth clamp pieces 64. The third rotation body 65 is attached to the other end of the third pole 61 away from the fourth clamping groove 63. The third rotation body 65 is received in the third clamping groove 53. The third rotation body 65 is rotatable around a center axis of the third pole 61 in the third clamping groove 53 and rotatable around an axis L2 perpendicular to an extended direction of the two third clamp pieces 54. Thus, an angle between the fourth connection member 60 and the third connection member 50 is adjustable when the fourth connection member 60 rotates around the axis L2.

Figure 5:
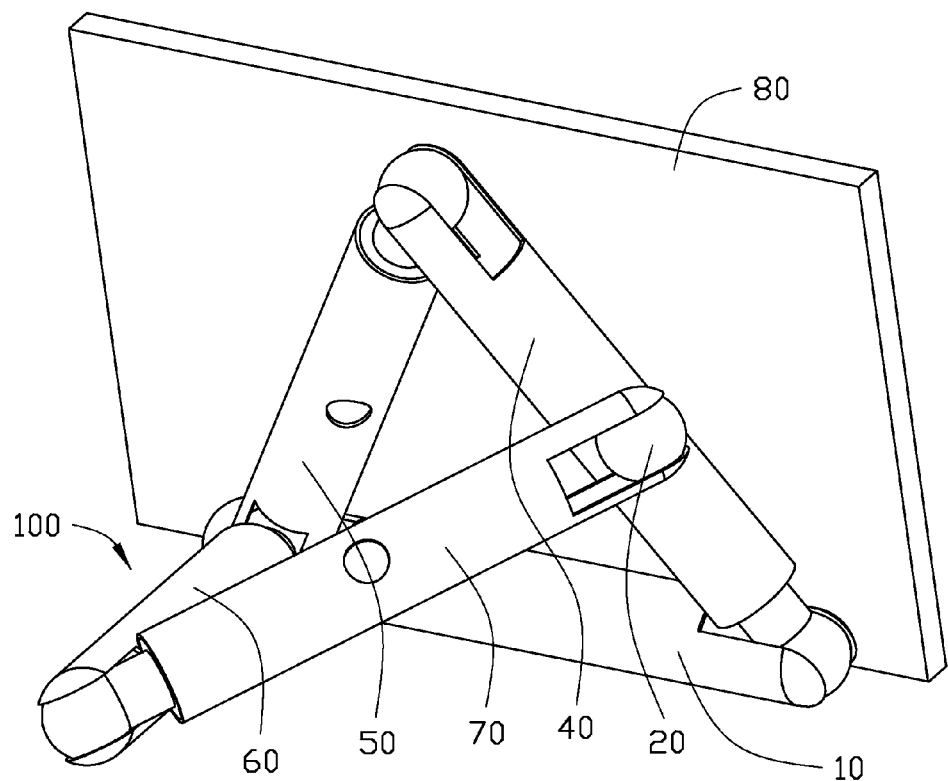
FIG. 5 is an isometric view of the supporting apparatus of FIG. 1 supporting an electronic device.

The fifth connection member 70 has a structure similar to the second connection member 40. The fifth connection member 70 includes a fourth pole 71 and a fourth rotation body 75. The fourth pole 71 is a substantially cylindrical. The fourth pole 71 includes two substantially parallel fifth clamp pieces 74 at one end of the fourth pole 71. A fifth clamping groove 73 is defined between the two fifth clamp pieces 74. The fourth rotation body 75 is attached to the other end of the fourth pole 71 away from the fifth clamping groove 73. The fourth rotation body 75 is received in the fourth clamping groove 63. The fourth rotation body 75 is rotatable around a center axis of the fourth pole 71 in the fourth clamping groove 63 and rotatable around an axis L3 perpendicular to an extended direction of the two fourth clamp pieces 64. Thus, an angle between the fifth connection member 70 and the fourth connection member 60 is adjustable when the fifth connection member 70 rotates around the axis L3. The fifth connection member 70 further includes a fixing member 20. The fixing member 20 is rotationally received in the fifth clamping groove 73. An end of the fixing member 20 can be received in the connection hole 411 to support the second connection member 40. In the embodiment, the fixing member 20 includes a ball 21 and a fixing portion 23 attached to the ball 21. The ball 21 is rotationally received in the fifth clamping groove 73. The fixing portion 23 is configured to be received in the connection hole 411. FIG. 5 illustrates when the first connection member 10, the second connection member 40 and the third connection member 50 are formed to a triangle and the fixing member 20 is received in the fixing hole 411, the supporting apparatus 100 can support an electronic device 80.

The embodiments shown and described above are only examples. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. A supporting apparatus comprising:
   a first connection member defining a fixing groove;
   a second connection member detachably attached to and rotatable around the first connection member, and defining a connection hole;
   a third connection member detachably attached to and rotatable around the second connection member, an end of the third connection member away from the second connection member detachably received in the fixing groove to form a triangle with the first connection member and second connection member together;
   a fourth connection member detachably attached to and rotatable around the third connection member; and
   a fifth connection member detachably attached to and rotatable around the fourth connection member, a portion of the fifth connection member detachably received in the connection hole to support the triangle.

2. The supporting apparatus as claimed in claim 1, wherein the first connection member, the second connection member and the third connection member can form an isosceles triangle.

3. The supporting apparatus as claimed in claim 1, wherein one end of the first connection member defines a first clamping groove away from the fixing groove, the second connection member comprises a rotation body, the rotation body is rotationally received in the first clamping groove.

4. The supporting apparatus as claimed in claim 3, wherein the first connection member comprises two first clamp pieces substantially parallel to each other, the first clamping groove is positioned between the two first clamp pieces.

5. The supporting apparatus as claimed in claim 4, wherein the first connection member is a substantially cylindrical pole, the fixing groove is defined at a lateral surface of the first connection member.

6. The supporting apparatus as claimed in claim 3, wherein the second connection member further comprises a pole attached to the rotation body, a second clamping groove is defined at an end of the pole away from the rotation body, the third connection member is rotationally received in the second clamping groove.

7. The supporting apparatus as claimed in claim 4, wherein the rotation body is a ball.

8. The supporting apparatus as claimed in claim 7, wherein the ball is elastic, a diameter of the ball is greater than a distance between the two first clamp pieces.

9. The supporting apparatus as claimed in claim 4, wherein the second connection member rotates around an axis perpendicular to an extended direction of the two first clamp pieces.

10. The supporting apparatus as claimed in claim 6, wherein the second connection member is further rotatable around a center axis of the pole.

11. A supporting apparatus comprising:
    a first connection member;
    a second connection member defining a connection hole;
    a third connection member;
    wherein the first connection member, the second connection member and the third connection member are rotationally connected to each other head to hail to form a triangle and can be detached from each other;
    a fourth connection member, one end of the fourth connection member detachably attached to and rotatable around one end of the third connection member connected to the first connection member; and
    a fifth connection member, an end of fifth connection member detachably attached to and rotatable around the other end of the fourth connection member away from the third connection member, and the other end of the fifth connection member away from the fourth connection member detachably received in the connection hole to support the triangle.

12. The supporting apparatus as claimed in claim 11, wherein the first connection member, the second connection member and the third connection member can form an isosceles triangle.

13. The supporting apparatus as claimed in claim 11, wherein one end of the first connection member defines a first clamping groove, the second connection member comprises a rotation body, the rotation body is rotationally received in the first clamping groove.

14. The supporting apparatus as claimed in claim 13, wherein the first connection member comprises two first clamp pieces substantially parallel to each other, the first clamping groove is positioned between the two first clamp pieces.

15. The supporting apparatus as claimed in claim 14, wherein the first connection member is a substantially cylindrical pole, the fixing groove is defined at a lateral surface of the first connection member.

16. The supporting apparatus as claimed in claim 13, wherein the second connection member further comprises a pole attached to the rotation body, a second clamping groove is defined at an end of the pole away from the rotation body, the third connection member is rotationally received in the second clamping groove.

17. The supporting apparatus as claimed in claim 14, wherein the rotation body is a ball.

18. The supporting apparatus as claimed in claim 17, wherein the ball is elastic, a diameter of the ball is greater than a distance between the two first clamp pieces.

19. The supporting apparatus as claimed in claim 14, wherein the second connection member rotates around an axis perpendicular to an extended direction of the two first clamp pieces.

20. The supporting apparatus as claimed in claim 16, wherein the second connection member is further rotatable around a center axis of the pole.

* * * * *